Oct. 5, 1954 J. A. WOLFF 2,691,056

THERMOELECTRIC DEVICE HAVING OPPOSING THERMOELECTRIC GENERATOR

Filed July 25, 1950

INVENTOR.
John A. Wolff
BY
Brown, Jackson, Boettcher & Dienner
Att'ys.

Patented Oct. 5, 1954

2,691,056

UNITED STATES PATENT OFFICE 2,691,056

THERMOELECTRIC DEVICE HAVING OPPOSING THERMOELECTRIC GENERATOR

John A. Wolff, Milwaukee, Wis., assignor to Milwaukee Gas Specialty Company, Milwaukee, Wis., a corporation of Wisconsin Application July 25, 1950, Serial No. 175,776

6 Claims. (Cl. 136—4)

This invention relates, in general, to thermoelectric devices, and has particular relation to an improved form of thermoelectric device comprising a plurality (i. e., two or more) of thermocouples or other thermoelectric generators (such as thermopiles), or combinations thereof, connected in circuit with each other in opposing relation.

One of the main objects of the present invention is to provide a thermoelectric device of the character described comprising a first thermoelectric generator and a lead conductor therefor, and wherein there are one or more opposing thermoelectric generators inserted as a part of the lead conductor for the first thermoelectric generator and thereby made a part of the structure of the first thermoelectric generator and its lead conductor.

The chief advantages of the invention are in avoiding the problem of insulating the one or more opposing thermoelectric generators, and in the provision of a structure of relatively simple and inexpensive construction which may be handled and operated conveniently and effectively, and wherein the thermoelectric generators of the device may be installed in a wide variety of different relations for a wide variety of different purposes, as will hereinafter appear.

Another object of the invention is to provide a thermoelectric device of the character described wherein the one or more opposing thermoelectric generators are built into the coaxial conducting lead of a coaxial thermoelectric generator, in general, of the type shown and described in Oscar J. Leins Patent No. 2,126,564, patented August 9, 1938.

Another object of the invention is to provide a device in which the opposing thermoelectric generator may be arranged to be heated to de-energize, for example, a magnet coil energized by the other thermoelectric generator; or in the manifold or mixing chamber of a gas burner as a safety flash-back control; or as a means for a timed control; or as a high temperature safety shut-off; or so that the plurality of thermoelectric generators will interact in timed relation to each other.

While I shall disclose certain illustrative uses of the device of the present invention, it is to be understood that the invention is not limited to such uses but may be employed for other purposes as suitable or desired.

Other objects and advantages and numerous adaptations of the invention will be apparent from the following detailed description and the accompanying drawings.

Figure 1:
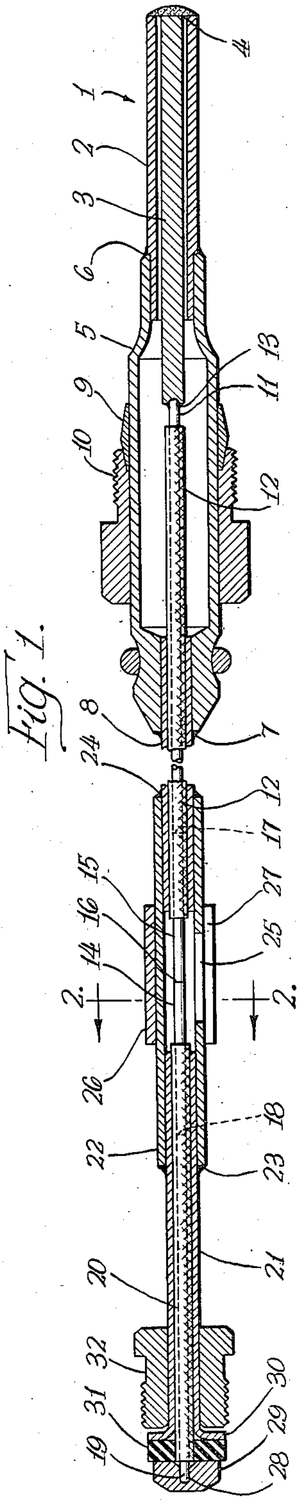
Figure 1 is a longitudinal sectional view taken axially through a device embodying the present invention.
Figure 3:
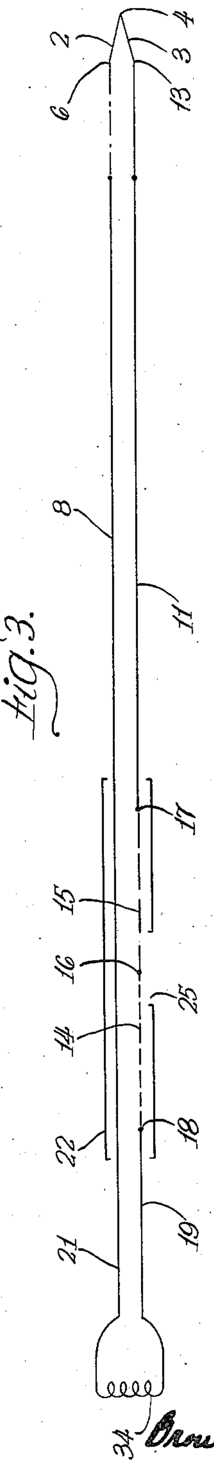
Figure 3 is a wiring diagram showing the thermoelectric circuit for the device shown in Figure 1.

Referring to the drawing, the thermoelectric device embodying the present invention as therein illustrated comprises a thermoelectric generator shown in the form of a coaxial thermocouple 1 with coaxial lead conductors therefor, in general, of the type disclosed and claimed in Oscar J. Leins Patent No. 2,126,564, patented August 9, 1938.

The thermocouple 1 comprises an outer tubular thermocouple element 2 enclosing an inner thermocouple element 3. The elements 2 and 3 may be formed of any suitable or preferred dissimilar thermoelectric materials. The element 2 may, for example, be formed of stainless steel, copel, constantan, Chromel, or any other metal in the thermoelectric series well known in the art, and the member 3 may be formed of the opposite or dissimilar metal separated in the thermoelectric series from the metal from which the element 2 is formed. While dissimilar metals in the thermoelectric series are referred to, it is to be understood that the present invention is not, in its broader aspects, limited to use of dissimilar metals. The elements 2 and 3 may be formed from dissimilar thermoelectric alloys or from any other dissimilar thermoelectric materials which, when joined together and heated at the hot junction, will produce a thermoelectric current.

It is to be further understood that the thermoelectric generator 1 may be in the form of a thermopile which, as well known in the art, comprises a plurality of thermocouples connected in series.

In the particular embodiment of the invention selected for illustration, the outer ends of the outer and inner elements 2 and 3 are welded or otherwise suitably joined together to provide a hot junction 4 which is adapted to be heated, as will presently appear. The opposite end of outer element 2 telescopes within and is brazed or otherwise joined to a conducting sleeve 5, the junction between the element 2 and sleeve 5 forming one cold junction 6 for the thermocouple 1.

The opposite end of the sleeve 5 telescopes over and is joined at 7 to the adjacent end of a tubular lead conductor 8. The sleeve 5 may have a compression sleeve 9 fixed thereon and a compression nut 10 is rotatable about sleeve 5 and cooperates with compression sleeve 9 for mounting the thermocouple 1, for example, in juxtaposition to a pilot burner as well understood in the art. An inner lead conductor 11, insulated at 12, extends through tubular conductor 8 and into sleeve 5, and, within sleeve 5, is brazed or otherwise joined to the adjacent end of inner thermocouple element 3 to form another cold junction 13 for the thermocouple 1.

Inserted as a part of the inner conductor 11, the present invention provides a second thermocouple which consists of two thermocouple elements 14 and 15 of dissimilar metals, alloys, or other suitable thermoelectric materials, for example, as set forth in connection with the thermocouple elements 2 and 3. The contiguous ends of elements 14 and 15 are joined together to provide a thermojunction 16, and the elements 14 and 15 are arranged in series opposing relation to the elements 2 and 3 of the thermocouple 1 so that when the junction 16 is heated a millivoltage will be generated reverse to the millivoltage generated by heating of the junction 4 of the thermocouple 1.

In the illustrated embodiment of the invention, the opposite end of element 15 is joined at 17 to the adjacent end of inner conductor 11. The opposite end of element 14 is joined at 18 to a lead conductor 19, which may be similar to conductor 11, and is insulated at 20. The conductor 19 extends through a tubular lead conductor 21, which may be similar to the tubular lead conductor 8, and has its inner end spaced axially from the end of the conductor 8. The gap between tubular conductors 21 and 8 is bridged by a conducting sleeve 22 which telescopes at its opposite ends over tubular conductors 21 and 8 and is joined, for example, by silver solder, or in any other suitable manner, to conductors 21 and 8, at 23 and 24 respectively.

Figure 2:
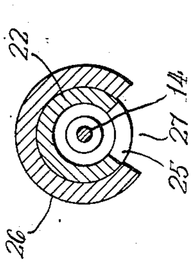
Figure 2 is a transverse sectional view taken on the line 2—2 of Figure 1.

The sleeve 22 has an opening 25 through which heat may be applied to the junction 16 as will presently appear. If desired, a ring 26 may be mounted for rotation on sleeve 22. This ring 26 is provided with an opening 27, as shown in Figures 1 and 2, for rotation into and out of register with the opening 25. When opening 27 is in register with opening 25, heat may be applied through the registering openings to the junction 16, and when opening 27 is out of register with opening 25 the junction 16 is completely surrounded so that heat cannot be applied directly to the junction 16.

Fixed at 28 on the outer end of inner conductor 19 is a conducting connector stud or tip 29 which is adapted to seat against a terminal tip or connector member of a thermoelectric control device to connect the thermoelectric generators, for example, in circuit with one end of the coil of an electromagnet for such device. The outer end of the tubular conductor 21 is belled out at 30, and an insulator 31 is interposed between the belled out end 30 of conductor 21 and the connector stud 29. A couple lead attaching nut 32 is rotatable about tubular conductor 21 and cooperates with the belled out end 30 of conductor 21 to attach the thermoelectric generator leads to the thermoelectric control device, with the tubular conductor 21, for example, connected in circuit with the other end of the coil of the electromagnet for such device.

The attaching nut 32 is adapted to be applied to a safety shut-off device, for example, in the manner shown in Harold A. Mantz Patent No. 2,409,947, patented October 22, 1946, to connect the thermoelectric generators 1 and 14—15 in circuit with the coil 34 of a safety control device which may, for example, be of the type shown in the Oscar J. Leins patent previously identified herein. With the device so applied, heating of the hot junction 4 of the thermocouple 1, for example, by the flame of a pilot burner, will energize the magnet coil 34 sufficiently to hold a shut-off valve open, or a switch for such valve closed as long as the junction 4 is thus heated.

By rotating the ring 26 to register the opening 27 with the opening 25 and applying heat, as, for example, from a match or other small flame, to the junction 16 through the registering openings 27 and 25, there is generated at the thermocouple 14—15 a millivoltage which is reverse to the millivoltage generated by heating of the junction 4 of the thermocouple 1. As a result, the coil 34 is deenergized sufficiently to release the armature and thereby the safety shutoff valve for movement to closed position shutting off the supply of fuel to the main burner.

The present invention thus provides a simple and convenient means for deenergizing the thermoelectric circuit without detaching the nut 32; also a device that may be handled, installed, and operated conveniently and effectively.

Figure 4:
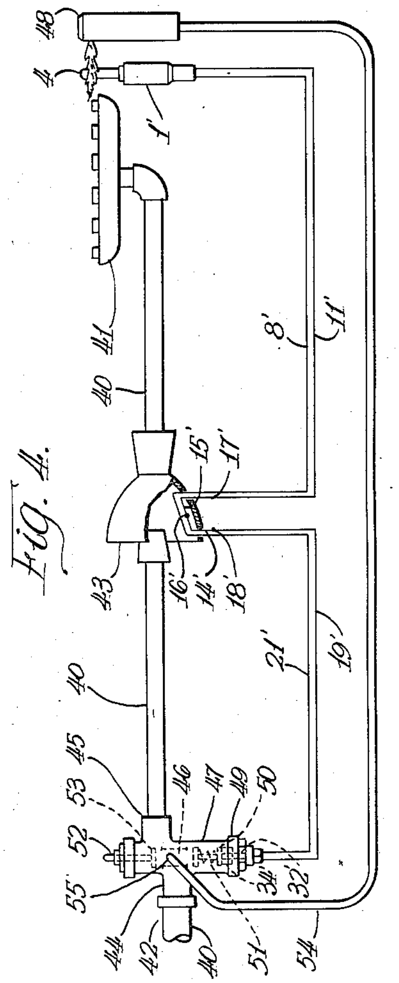
Figure 4 is a more or less diagrammatic view showing the device arranged for safety pilot and safety flash-back control.

As an example of another use of the invention, Figure 4 shows the same installed as a flash-back control.

In Figure 4 a fuel supply pipe or conduit 40 leads to a burner 41 for the delivery of gaseous fuel thereto through a mixing chamber 43 to which air is admitted through adjustable air inlets (not shown), as well understood in the art.

Interposed in the fuel supply pipe 40 is a thermoelectric safety shut-off valve 42. The thermoelectric safety shut-off valve 42 may be, in general, of the type shown and described in Clarence Wantz Patent No. 2,307,870, issued January 12, 1943. Suffice it to state that it comprises a valve body having an inlet at 44 for receiving gaseous or other fuel, and an outlet at 45 through which the fuel is delivered to the burner 41. Contiguous sections of pipe 40 are connected to inlet 44 and outlet 45. A port or passage, shown more or less diagrammatically in dotted lines at 46, provides for communication between inlet 44 and outlet 45. A safety shut-off valve, shown in dotted lines at 47, is adapted to seat, for example, upon a valve seat at one end of port 46 to shut off the flow of fuel to the main burner 41; also the flow of fuel for a pilot burner 48 located in juxtaposition or in lighting proximity to the burner 41.

An electromagnet having a magnet frame 49 and a coil 34′, corresponding with the coil 34 previously described, is adapted for holding armature 50 connected to valve 47 in attracted position and thereby the valve 47 open when the hot junction 4′ of thermoelectric generator 1′, which corresponds with the thermocouple 1 previously described, is heated by the flame of the pilot burner 48. When the pilot burner 48 is extinguished, the electromagnet, which is connected in circuit with the thermoelectric generator 1′, ceases to hold the valve 47 open, and this valve moves to closed position, for example, under the action of a spring 51 to shut off the supply of fuel to burner 41; also the supply of fuel to the pilot burner 48.

A reset button 52 is adapted to be pressed inwardly to move valve 47 to open position with accompanying movement of armature 50 to attracted position and to hold the armature in attracted position until the pilot burner 48 is ignited and heats the hot junction 4' of thermoelectric generator 1' sufficiently to retain armature 50 attracted and valve 47 open. A flow interrupter valve 53 may be provided for shutting off the flow of fuel to the main burner 41 during the resetting operation and until valve 47 is held in open position by the electromagnet and button 51 is released and returns to its outwardly projecting position with accompanying operation of the flow interrupter valve 53 to open position. The details and mode of operation of a suitable reset and flow interrupter valve arrangement are shown and described in the above identified patent of Clarence Wantz; also in Charles V. Hildebrecht Patent No. 2,114,446, issued April 19, 1938.

The pipe 54 for supplying fuel to the pilot burner 48 may be connected, for example, as shown more or less diagrammatically at 55 to the interior of the body of the thermoelectric safety shut-off valve 42 between the above mentioned valve seats at opposite ends of the port or passage 46. In this way, valve 47, when in closed position, shuts off the supply of fuel to both the main burner 41 and pilot burner 48, and fuel flows to the pilot burner 48 whenever the valve 47 is open and regardless of whether the flow interrupter valve 53 is open or closed.

With the present invention installed for use as a flashback control for the system shown in Figure 4, the thermocouple 14'—15', with its hot junction 16' which corresponds with the thermocouple 14—15 and hot junction 16 previously described, are located in the mixing chamber 43 as shown in Figure 4, or in the intake manifold for the burner 41. The attaching nut 32', which corresponds with the attaching nut 32 previously described, is applied to the safety shut-off valve 42 and connects the thermocouples 1' and 14'—15' in circuit with the coil 34' of the electromagnet.

In operation, cocking of the thermoelectric safety valve 42, by depressing the button 52, opens the valve 47, thus admitting gas which passes through the pipe 54 to the pilot burner 48. In cocking or resetting the thermoelectric safety shut-off valve, the flow interrupter valve member 53 moves to closed position to shut off the flow of fuel to the main burner 41 during the resetting operation and until the pilot burner 48 is ignited and heats the hot junction 4' of thermoelectric generator 1' sufficiently to hold valve 47 open. Then, upon release of button 52, valve member 53 moves to open position, admitting gas to the main burner 41.

In case a flash-back condition occurs, the hot junction 16' of the thermocouple 14'—15' becomes heated. There is thereby generated at the thermocouple 14'—15' a millivoltage which is reversed to the millivoltage generated by heating of the junction 4' of the thermocouple 1'. As a result, the coil 34' is deenergized sufficiently by the occurrence of a flash-back condition to release the armature 50 and thereby the valve 47 for movement to closed position shutting off the supply of fuel to the main burner 41; also to the pilot burner 48.

While I have shown and described the invention for use by applying a flame to the hot junction 16, and for use as a flash-back control, it is to be understood that the invention is not limited to such uses, but may be used as a high temperature safety shut-off by arranging the junction 16 or 16' of the thermocouple 14—15, or 14'—15', where it will be heated by the high temperature condition; also as a timed control, and so that a plurality of thermoelectric generators will interact in timed relation to each other.

The embodiments of the invention shown in the drawing are for illustrative purposes only, and it is to be expressly understood that said drawings and the accompanying specification are not to be construed as a definition of the limits or scope of the invention, reference being had to the appended claims for that purpose.

I claim:

1. A thermoelectric generator and lead connection comprising, in combination, a first inner thermoelectric generator element, at least one pair of additional inner thermoelectric generator elements coaxial with respect to each other and with respect to said first inner thermoelectric generator element and connected in circuit with said first inner thermoelectric generator element, said additional inner thermoelectric generator elements being joined together to form a first thermojunction, and tubular conducting means enclosing said first inner thermoelectric generator element also said additional thermoelectric generator elements and said thermojunction between said additional thermoelectric generator elements, said tubular conducting means comprising an outer tubular thermoelectric generator element at least partially surrounding said first inner thermoelectric generator element and joined to said first inner thermoelectric generator element to form a second thermojunction adapted to be heated.

2. A thermoelectric generator and lead connection according to claim 1 wherein there is an intermediate internal lead conductor coaxial with respect to said first internal thermoelectric generator element and said additional inner thermoelectric generator elements and disposed between and joined at opposite ends to said first internal thermoelectric generator element and to one of said additional thermoelectric generator elements to form two additional internal thermojunctions, said intermediate internal lead conductor and said additional internal thermojunctions being also enclosed by said tubular conducting means.

3. A thermoelectric generator and lead connection according to claim 1 wherein there is a terminal internal lead conductor coaxial with respect to said first internal thermoelectric generator element and said additional thermoelectric generator elements and joined to one of said additional inner thermoelectric generator elements, said terminal internal lead conductor being also enclosed by said tubular conducting means and projecting from one end thereof, a connector tip on the projecting end of said terminal internal lead conductor, a radial flange on the adjacent end of said tubular conducting means, insulation between said flange and said connector tip, and a lead attaching nut rotatable about the external surface of said tubular conducting means and cooperable with said radial flange.

4. A thermoelectric generator and lead connection according to claim 1 wherein said tubular conducting means has an opening adjacent to said first thermojunction through which heat may be applied to said first thermojunction.

5. A thermoelectric generator and lead connection according to claim 1 wherein said tubular conducting means has an opening adjacent to said first thermojunction through which heat may be applied to said first thermojunction, and a ring having an opening therein and rotatable about the external surface of said tubular conducting means adjacent to the opening in said tubular conducting means to move the opening in said ring into and out of register with the opening in said tubular conducting means.

6. A thermoelectric generator and lead connection comprising, in combination, a first inner thermoelectric generator element, at least one pair of additional inner thermoelectric generator elements coaxial with respect to each other and with respect to said first inner thermoelectric generator element and connected in circuit with said first inner thermoelectric generator element, said additional inner thermoelectric generator elements being joined together to form a first thermojunction, tubular conducting means enclosing said first inner thermoelectric generator element also said additional thermoelectric generator elements and said thermojunction between said additional thermoelectric generator elements, said tubular conducting means comprising an outer tubular thermoelectric generator element at least partially surrounding said first inner thermoelectric generator element and joined to said first inner thermoelectric generator element to form a second thermojunction adapted to be heated, a first internal lead conductor coaxial with respect to said first internal thermoelectric generator element and said additional inner thermoelectric generator elements and disposed between and joined at opposite ends to said first internal thermoelectric generator element and to one of said additional thermoelectric generator elements to form two additional internal thermojunctions, said first internal lead conductor and said additional thermojunctions being also enclosed by said tubular conducting means, a second internal lead conductor coaxial with respect to said first internal thermoelectric generator element and said additional thermoelectric generator elements and joined to the other of said additional inner thermoelectric generator elements, said second internal lead conductor being also enclosed by said tubular conducting means and projecting from one end thereof, a connector tip on the projecting end of said internal lead conductor, a radial flange on the adjacent end of said tubular conducting means, insulation between said flange and said connector tip, a lead attaching nut rotatable about the external surface of said tubular conducting means and cooperable with said radial flange, said tubular conducting means having an opening adjacent to said first thermojunction through which heat may be applied to said first thermojunction, and a ring having an opening therein and rotatable about the external surface of said tubular conducting means adjacent to the opening in said tubular conducting means to move the opening in said ring into and out of register with the opening in said tubular conducting means.

References Cited in the file of this patent

UNITED STATES PATENTS

| Number | Name | Date |
|---|---|---|
| 1,103,640 | Wilson | July 14, 1914 |
| 2,126,564 | Leins | Aug. 9, 1938 |
| 2,375,569 | McCarty | May 8, 1945 |
| 2,384,696 | Ray | Sept. 11, 1945 |
| 2,385,530 | Paille | Sept. 25, 1945 |
| 2,407,517 | Ray | Sept. 10, 1946 |
| 2,518,804 | Marvin | Aug. 15, 1950 |